US011362799B2

United States Patent
Sun et al.

(10) Patent No.: US 11,362,799 B2
(45) Date of Patent: Jun. 14, 2022

(54) DIGITAL RETURN RECEIVER WITH DIGITAL DATA AGGREGATION

(71) Applicant: ARRIS Enterprises LLC, Suwanee, GA (US)

(72) Inventors: Zhijian Sun, Wallingford, CT (US); Dean Painchaud, Wallingford, CT (US); Zoran Maricevic, Wallingford, CT (US)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 17/104,260

(22) Filed: Nov. 25, 2020

(65) Prior Publication Data

US 2021/0160045 A1 May 27, 2021

Related U.S. Application Data

(60) Provisional application No. 62/940,672, filed on Nov. 26, 2019.

(51) Int. Cl.
*H03D 3/24* (2006.01)
*H04L 7/027* (2006.01)

(52) U.S. Cl.
CPC .................................. *H04L 7/027* (2013.01)

(58) Field of Classification Search
CPC .... H04L 7/027; H04N 7/17309; H04N 7/173; H04J 1/00
USPC ........ 375/355, 372, 373, 326, 257, 219, 220
See application file for complete search history.

(56) References Cited

U.S. PATENT DOCUMENTS

| 5,790,538 A | 8/1998 | Sugar |
| 9,461,744 B2 | 10/2016 | Bowler et al. |
| 10,211,922 B2 | 2/2019 | Mutalik et al. |
| 2002/0056133 A1 | 5/2002 | Fung et al. |
| 2003/0156602 A1* | 8/2003 | Sage ................... H04N 7/17309 370/480 |
| 2017/0237491 A1 | 8/2017 | Mutalik et al. |
| 2017/0237492 A1 | 8/2017 | Mutalik et al. |

OTHER PUBLICATIONS

International Search Report and Written Opinion Re: Application No. PCT/US2020/062169 (dated Mar. 10, 2021).

* cited by examiner

*Primary Examiner* — Phuong Phu
(74) *Attorney, Agent, or Firm* — Chernoff, Vilhauer, McClung & Stenzel, LLP

(57) ABSTRACT

In some embodiments, a digital clock management system includes input signal conversion circuitry, logic circuitry and output signal conversion circuitry. The input signal conversion circuitry converts input signals to corresponding first digital data streams, each of which contains digital data synchronized to a first data clock. First digital logic circuitry converts the first digital data streams to second digital data streams, each of which contains digital data synchronized to the first data clock, and converts the second digital data streams to third digital data streams, each of which contains digital data synchronized to a common clock. Second digital logic circuitry converts the third digital data streams to a single digital data stream. The output signal conversion circuitry converts the single digital data stream to a modulated output signal.

20 Claims, 9 Drawing Sheets

DIGITAL RETURN RECEIVER WITH DIGITAL DATA AGGREGATION

CROSS REFERENCE TO RELATED APPLICATIONS

This application claims benefit of U.S. Provisional Patent Application No. 62/940,672, entitled "DIGITAL RETURN RECEIVER WITH DIGITAL DATA AGGREGATION," filed Nov. 26, 2019, which application is hereby incorporated by reference herein.

BACKGROUND

In a hybrid fiber coaxial (HFC) network (e.g., as often used to distribute Internet and/or cable television services), digital return transmitters (TXs) and receivers (RXs) are commonly used for upstream communications. For example, in low density service areas, the outputs of many digital return receivers may be combined to a single output so as to aggregate a sufficient number of users into a single "service group". Conventional systems do this in the analog radio frequency (RF) signal domain following any signal processing and/or conditioning performed prior to a digital-to-analog conversion (DAC) process. This typically requires uses of multiple digital logic circuits, DAC circuits and RF signal operations (e.g., amplifiers, filters, frequency converters, etc.). The use of this many devices and/or subsystems, particularly in the RF domain, negatively impact system cost (higher) and power efficiency (lower).

For example, FIG. 1 depicts a digital return receiver architecture according to conventional techniques. In a commonly used HFC system architecture, multiple digital return receiver paths may need to be combined. As depicted here, a conventional 8-channel implementation first retrieves the digital data from incoming optical signals, e.g., via photodiodes 12 and buffer amplifiers 14. The resulting data signals 15 (e.g., in the form of differential data signals) are then processed in logic circuits 16 (e.g., field programmable gate arrays). The processed data signals 17 are then converted by DAC circuits 18 to corresponding analog signals 19 which are then combined and amplified in RF circuitry 20. As shown here, this typically requires use of at least four logic circuits 16 (e.g., dual channel FPGAs), four DACs 18 (e.g., dual channel DACs) and RF circuitry 20 that includes seven 2:1 RF signal combiners (each of which adds more than 3 dB of RF signal attenuation). Though simple to implement, this approach results in increased cost and circuit size (e.g., increased cumulative volume of the RF devices and/or printed circuit board area) as well as power consumption.

DETAILED DESCRIPTION

Figure 1:
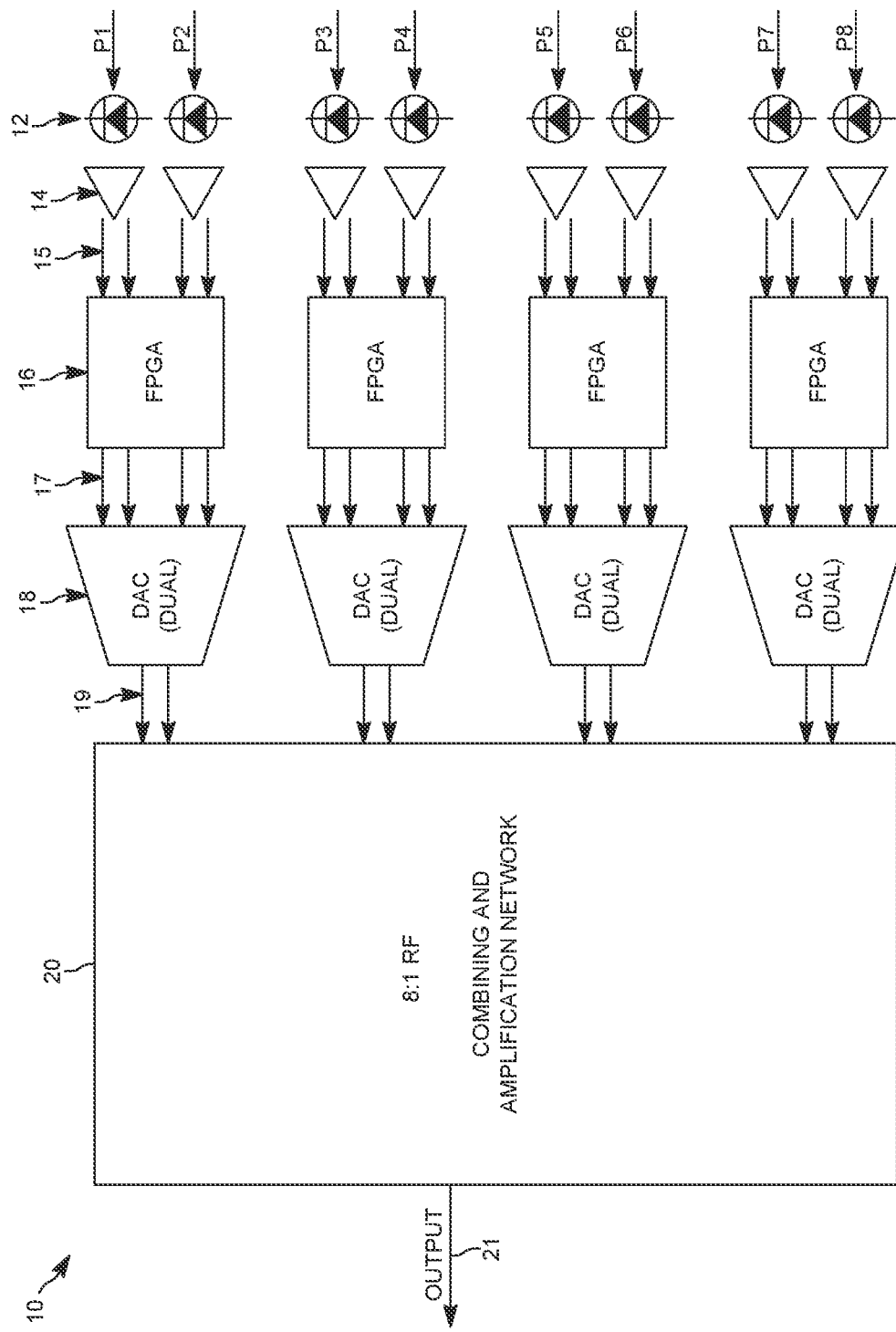
FIG. 1 depicts a digital return receiver architecture according to conventional techniques.

Described herein are digital return receiver designs with digital data aggregation. In the following description, for purposes of explanation, numerous examples and specific details are set forth in order to provide a thorough understanding of some embodiments. Some embodiments as defined by the claims may include some or all of the features in these examples alone or in combination with other features described below and may further include modifications and equivalents of the features and concepts described herein.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while some embodiments have been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry.

As discussed in more detail below, in accordance with example embodiments, the multiple return digital data signals may be combined (e.g., summed) within a single circuit (e.g., a single FPGA). The resultant combined digital signal may then be converted with a single DAC circuit to an analog signal which, in turn, is converted to an RF signal with no need for loss-inducing RF signal combiners. Such a digital combining technique advantageously reduces system cost and size and increases power efficiency.

Such combining of multiple digital data signals may best be performed by using a common timing base for all signals to be combined prior to their presentation to the DAC for digital-to-analog conversion. Otherwise, each individual Digital Return transmit (TX) subsystem will have its own clock running independently of the others, thereby resulting in each having a slightly differing time base that differs, at least slightly, from the others, and may vary over time as well. As discussed in more detail below, example embodiments may use a common timing base, which may be produced by a number of techniques. For example, one technique includes transmission of a common reference tone via an existing downstream signal path for distribution to and use by each digital return transmitter (TX) subsystem in producing its upstream digital data signal. Alternatively, in another technique, re-sampling may be done of each upstream digital data signal following recovery of its data and clock components.

System Overview

Figure 2:
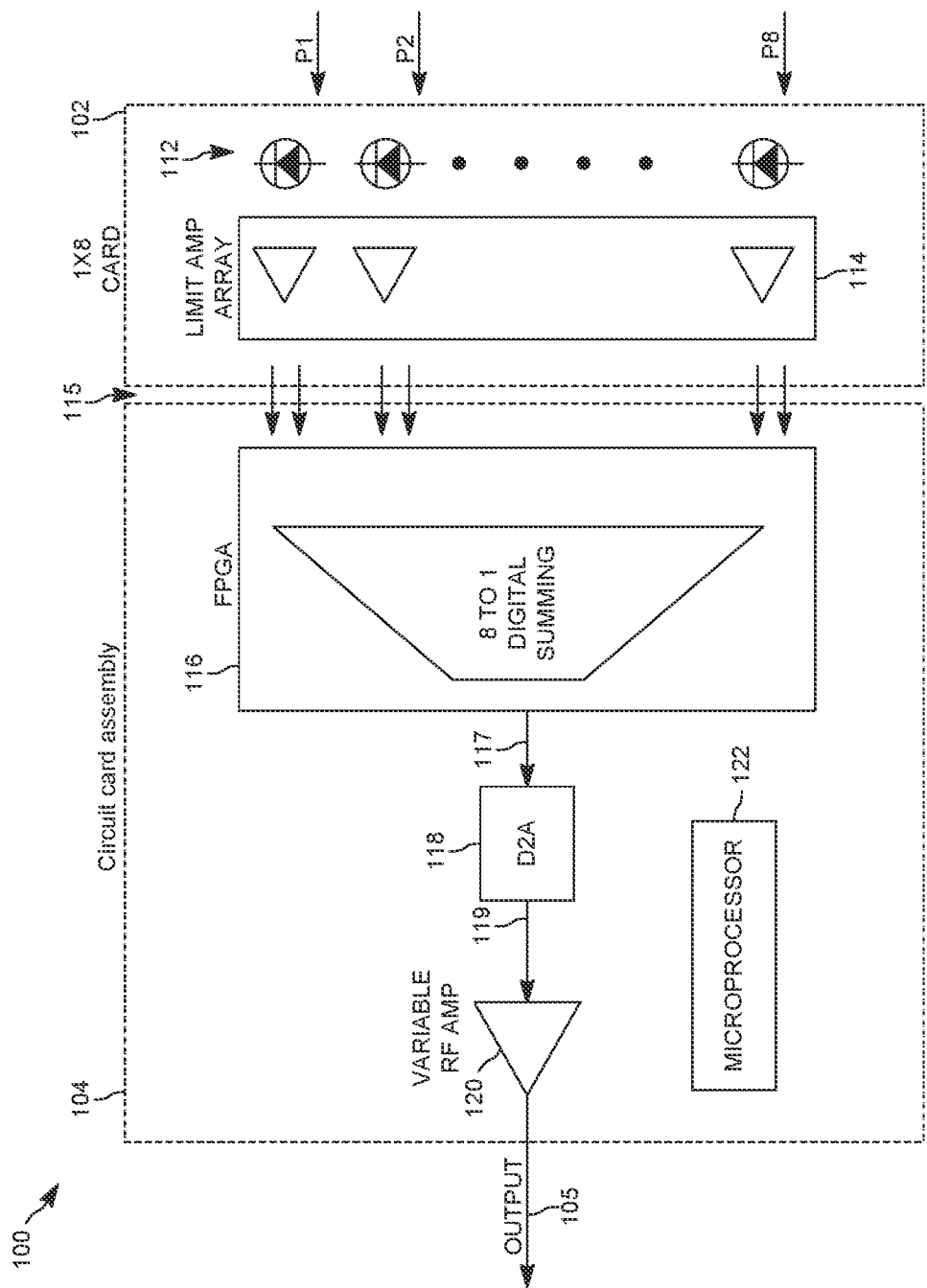
FIG. 2 depicts a digital return receiver architecture according to example embodiments.

FIG. 2 depicts a digital return receiver architecture according to example embodiments. Although an 8-channel implementation is described as an example, variations may be appreciated. Circuit card assembly 102 recovers the digital data from incoming optical signals, e.g., via photodiodes 112 and buffer amplifiers 114, or other logic. The resulting electrical digital data signals 115 (e.g., in the form of differential data signals) may then be conveyed to another circuit card assembly 104 containing logic circuitry 116 (e.g., a field programmable gate array) according to example embodiments.

Following processing of the digital data signals 115 by the logic circuitry 116 (discussed in more detail below), a combined digital data signal 117 may be converted by a digital-to-analog converter (DAC) circuit 118 to an analog signal 119. This analog signal 119 may then be amplified by a RF amplifier 120 (e.g., having a variable RF signal gain to enable setting an appropriate output signal level) to produce the RF output signal 105 of the digital return transmitter subsystem. A digital signal with the data from RF output signal 105 is sent to the headend.

In a distributed access architecture (DAA), a remote PHY device (RPD) node moves the physical layer from the CMTS headend to the network edge. From headend to RPD node, the data may be carried through a 10 Gbps small form factor pluggable (SFP) transceiver, and after the RPD node, the data has been converted to analog RF signals, both in downstream and upstream. The downstream signal may be converted from a RF signal to a 1550 nm optical signal and transmitted through a downstream transmitter to multiple (e.g., eight) remote nodes. The upstream signals are converted from analog to digital first in the remote nodes, and then combined inside the RPD node and converted back to analog signals, combined inside the RPD node digital return receiver, and transmitted upstream.

Common Reference Timing Signal

Figure 3A:
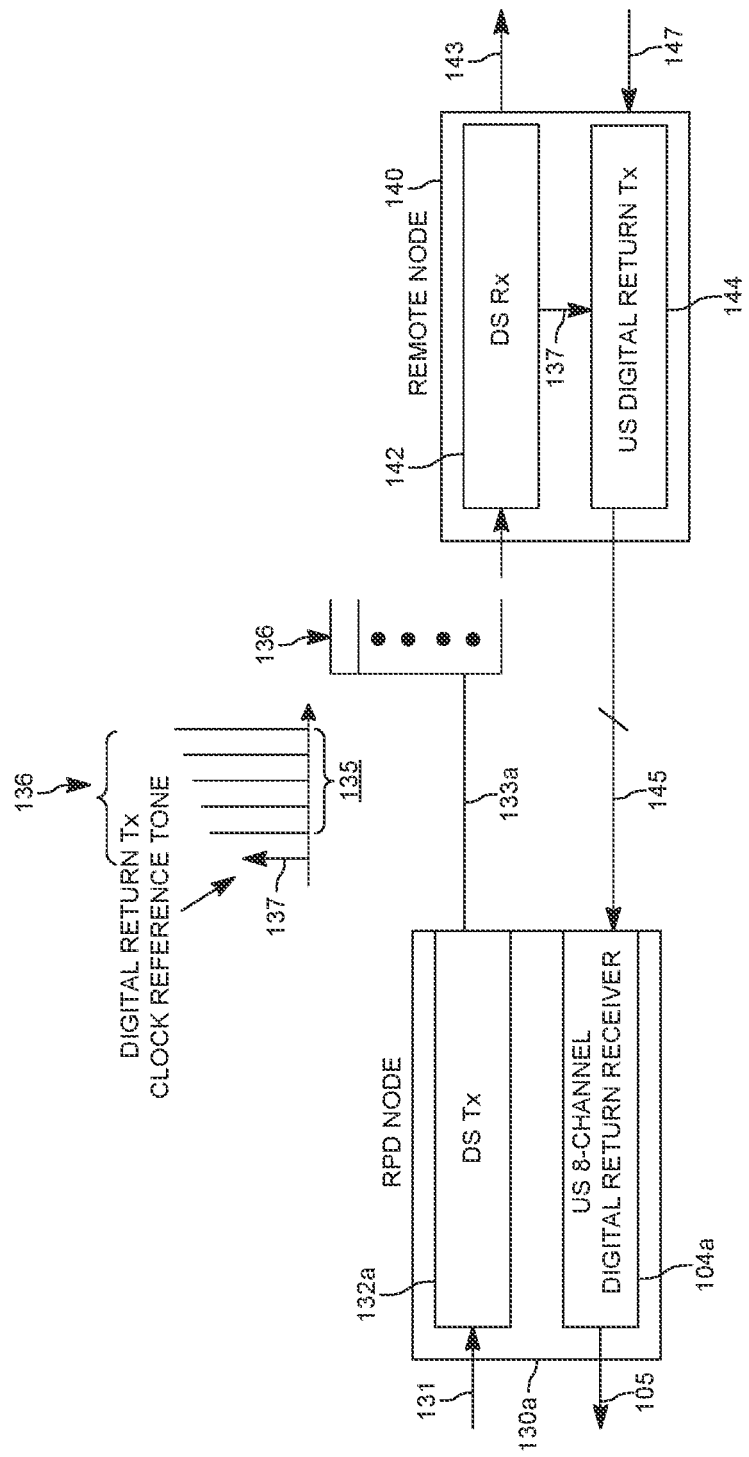
FIG. 3A depicts downstream and upstream signal flows of a remote physical devices (RPD) node and a remote node according to example embodiments.

FIG. 3A depicts downstream and upstream signal flows of a remote physical device (RPD) node and a remote node according to example embodiments. RPD node 130a may be remote from a head end and receive a downstream signal (e.g., an optical signal including digital data) destined for subscriber devices (not shown). RPD node 130a may forward the signal to a remote node 140 in the downstream direction. In the upstream direction, remote nodes 140 may convert the analog signal to digital and forward the digital signal to a RPD node 130a. Inside RPD node 130a, it may convert the digital signal back to an analog signal. Although one remote node 140 is shown, RPD node 130a may be coupled to multiple remote nodes 140 that perform the same functions. RPD node 130a adds a common reference timing signal to the downstream signal for use later in the upstream direction to form a common timing base.

In the process, RPD node 130a includes downstream transmitter circuitry 132a for converting an incoming downstream signal 131 to the downstream signal 133a to be conveyed to a remote node 140. This downstream signal 133a may include a signal, such as a continuous wave (CW) signal 137. Continuous wave signal 137 may be inserted in downstream signal 131 separately from normal downstream signals 135 that are sent to subscriber devices, such as by frequency (e.g., at a frequency outside of (e.g., lower than) the frequency spectrum containing the normal downstream signals 135), or by other methods. Continuous wave signal 137 is to serve as the common reference timing signal in the digital return transmitter subsystem (discussed in more detail below).

Downstream signal 133a, with its full spectrum 136 of signal components including continuous wave signal 137 and normal downstream signals 135, is received and processed by a downstream (DS) receiver subsystem 142 in the remote node 140 to separate out the continuous wave signal 137. Also, downstream receiver subsystem 142 separates the normal downstream signals 135 from continuous wave signal 137 for distribution as one or more subscriber signals 143. Downstream receiver subsystem 142 sends the subscriber signals 143 downstream towards subscriber devices. Also, downstream receiver subsystem 142 sends continuous wave signal 137 to digital return transmitter subsystem 144, which uses continuous wave signal 137 when sending the upstream signal. That is, continuous wave signal 137 is not sent to subscriber devices.

In the upstream direction, remote node 140 receives one or more incoming upstream signals 147 from subscriber devices. Remote node 140 may convert the analog upstream signal to digital. Digital return transmitter subsystem 144 (discussed in more detail below) processes upstream signals 147 using continuous wave signal 137 as a common timing base to produce one or more upstream signals 145 for conveyance to a digital return receiver 104a in the RPD node 130a.

Figure 3B:
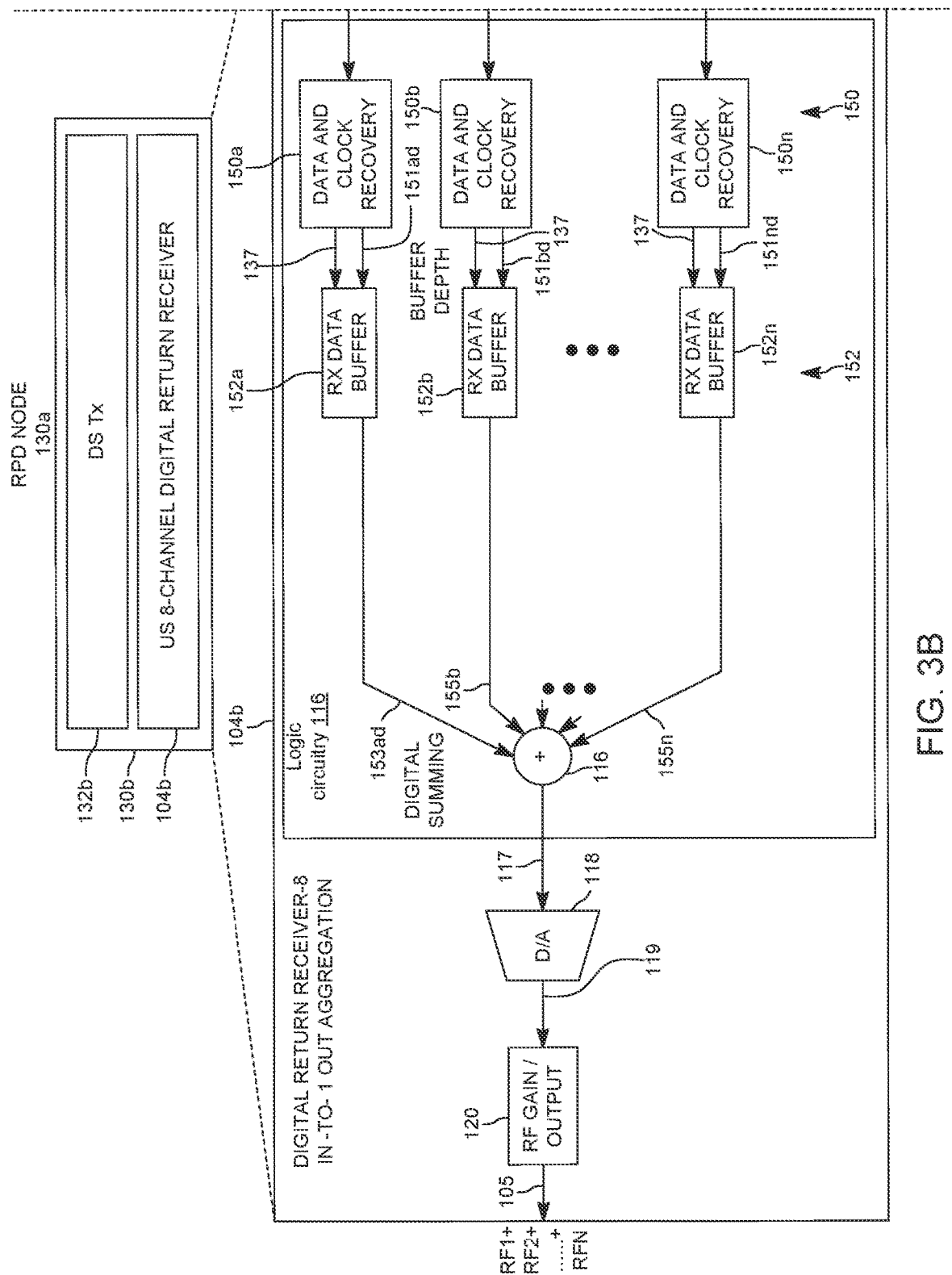
FIGS. 3B-3C depict upstream signal flows of a digital return receiver architecture for use in a RPD node using the common reference timing signal according to some embodiments.
Figure 3C:
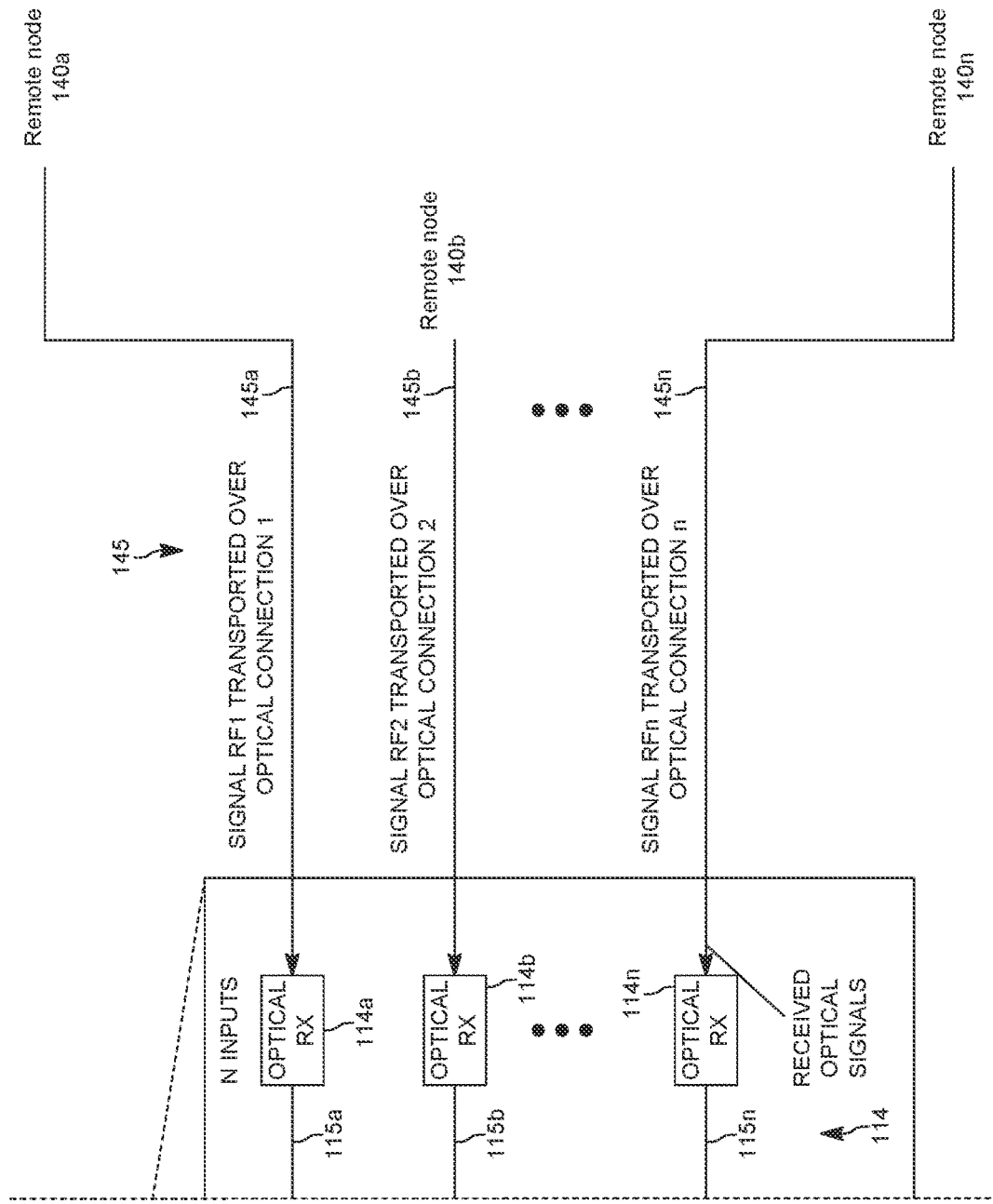

FIGS. 3B-3C depict upstream signal flows of a digital return receiver architecture for use in a RPD node using the common reference timing signal according to some embodiments. FIGS. 3B-3C are split across figures, but form a connected system between RPD node 130a and multiple remote nodes 140a, 140b, . . . , 140n. RPD node 130a receives upstream optical signals 145a, 145b, . . . , 145n from multiple remote nodes 140. RPD node 130a also receives continuous wave signal 137 that was sent as part of the downstream signal.

As discussed in more detail below, in digital return receiver 104b, each signal will be received based on a clock using continuous wave signal 137 and stored temporarily in a buffer. The rate at which the samples are read out from the buffer may be derived from continuous wave signal 137, which arrives via every optical signal. For example, the upstream signals generated using the transmitters synchronized with the downstream CW tone 137 may be received with all having the same input clock rates for all data buffers 152a, 152b, 152n.

More particularly, the upstream optical signals 145a, 145b, . . . , 145n from different remote nodes 140 are converted by respective optical receiver circuits 114a, 114b, . . . , 114n to corresponding digital data signals 115a, 115b, . . . , 115n for processing by the logic circuitry 116. One example of such logic circuitry 116 may be implemented using a field programmable gate array (FPGA), which enables one type of device to be stocked and available for deployment as well as customizations or updates to its operations. However, other forms of logic circuitry may also be used, including custom integrated circuit designs, application specific integrated circuits (ASICs), and so on.

In logic circuitry 116, data and clock recovery circuits 150a, 150b, . . . , 150n process digital data signals 115a, 115b, . . . , 115n to recover the digital data streams and their respective clocks, e.g., by performing data frame synchronization and timing recovery. Such recovery circuits 150a, 150b, . . . , 150n are well known to those skilled in the art and may be implemented using clock and data recovery circuits, delay-locked loop (DLL) circuits, or oversampling circuits.

Buffers 152a, 152b, and 152n receives the data signals and continuous wave signal 137. The data is read out of buffers 152a, 152b, and 152n using a clock based on continuous wave signal 137 and is thus synchronized to a common timing base.

At this point, output data 153ad, 155b, . . . , 155n from buffers 152a, 152b, and 152n are synchronized to the same clock timing base. Digital summing logic 116 digitally sums output data 153ad, 155b, . . . , 155n. Following such processing by the digital summing logic 116, the combined digital data signal 117 may be converted by a digital-to-analog converter (DAC) circuit 118 to an analog signal 119. The resulting analog signal 119 may then be amplified by a RF amplifier 120 (e.g., having a variable RF signal gain to enable setting an appropriate output signal level) to produce the RF output signal 105 of the digital return transmitter subsystem. A digital signal with the data from RF output signal 105 is sent to the headend.

Adaptive Resampling

Figure 4A:
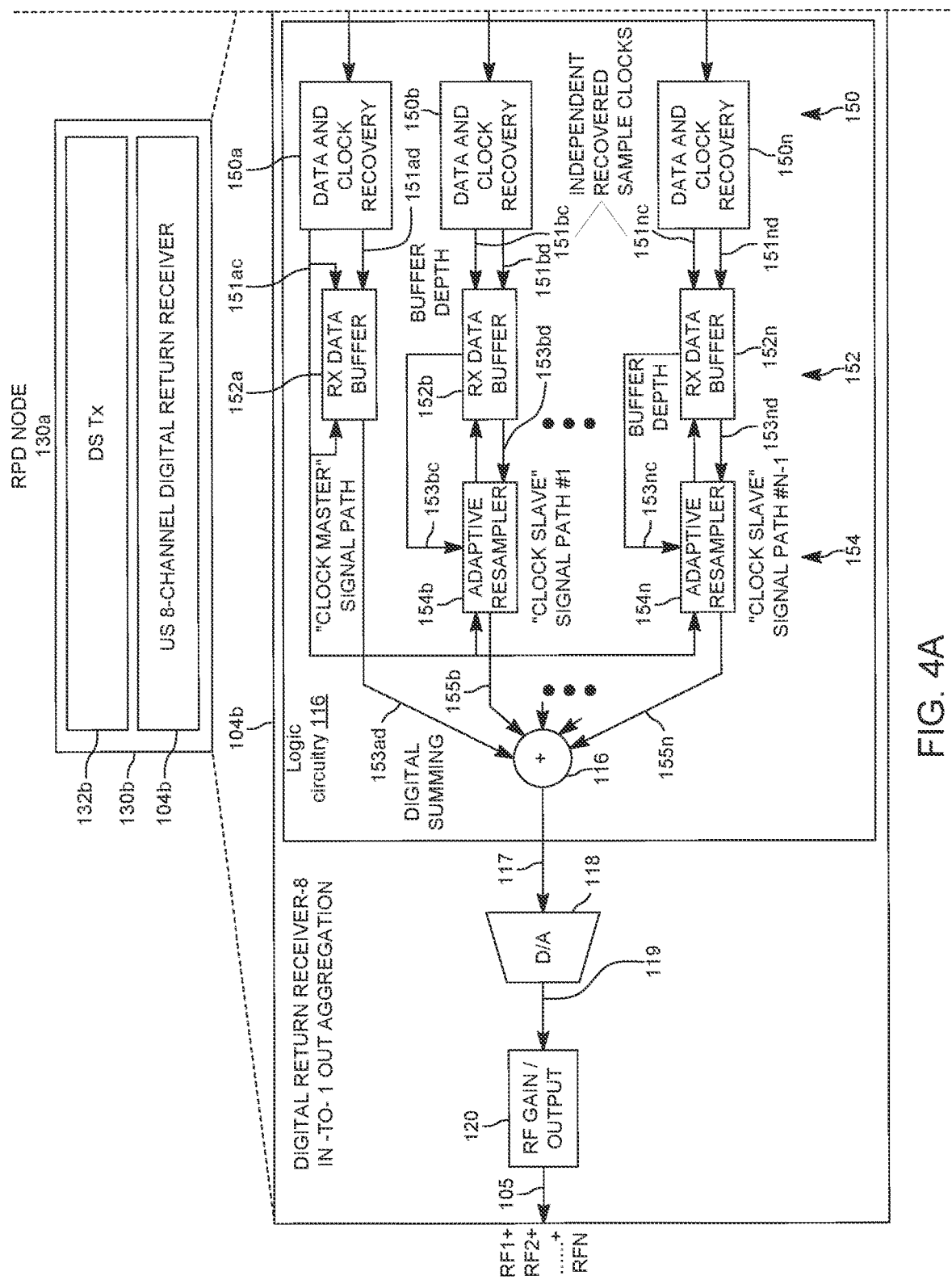
FIGS. 4A-4B depict upstream signal flows of a digital return receiver architecture for use in a RPD node according to example embodiments.
Figure 4B:
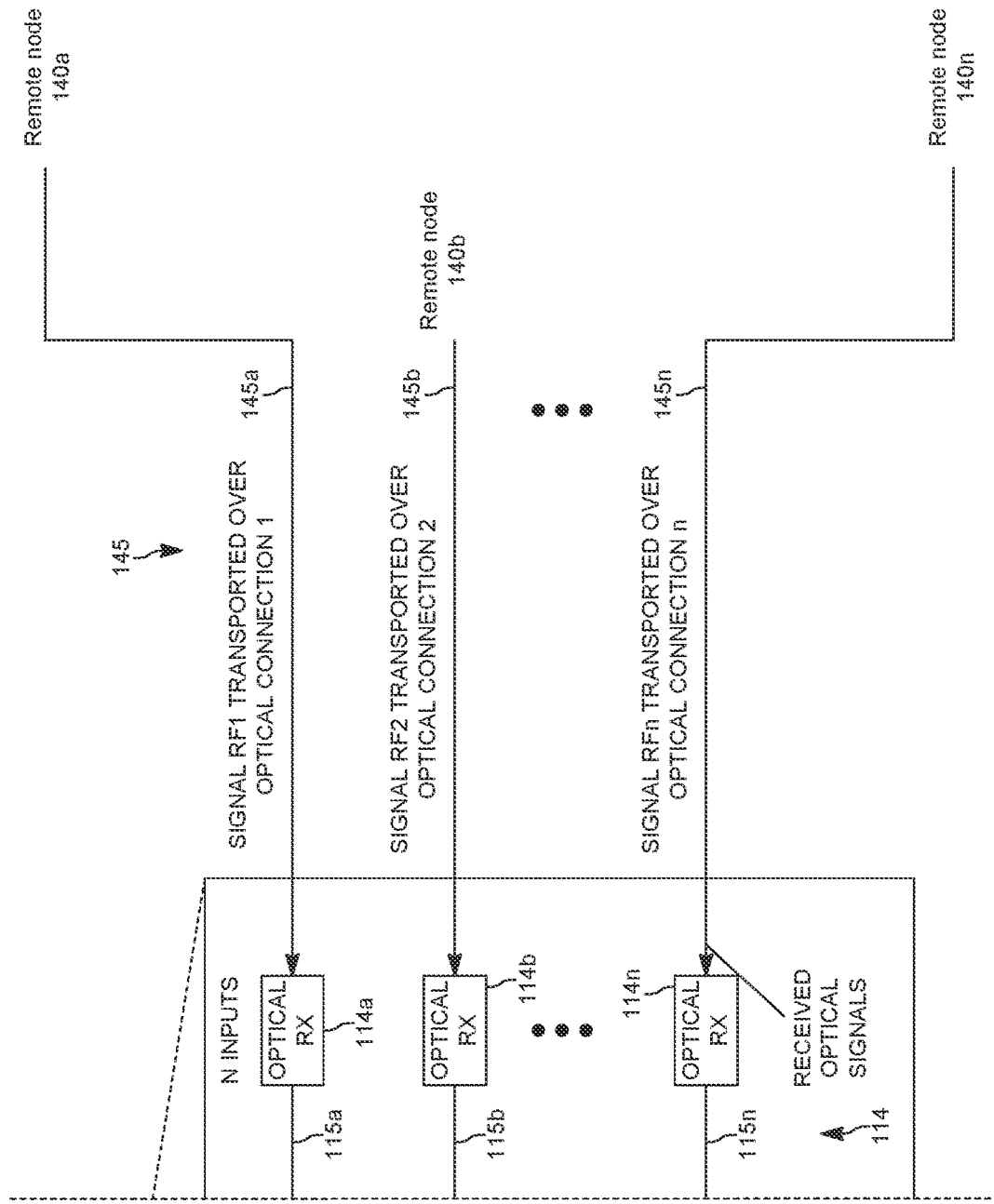

FIGS. 4A-4B depict upstream signal flows of a digital return receiver architecture for use in a RPD node using adaptive resampling according to some embodiments. FIGS. 4A-4B are split across figures, but form a connected system between RPD node 130a and multiple remote nodes 140. RPD node 130a receives upstream optical signals 145a, 145b, . . . , 145n from multiple remote nodes 140a, 140b, . . . , 140n. While RPD node 130a synchronizes all of the upstream optical signals 145a, 145b, . . . , 145n to a clock signal having substantially the same nominal frequency, each clock will nonetheless vary slightly from the others, in terms of frequency and/or phase, and over both shorter and longer time intervals. As known in the art, such variances, albeit slight, are caused by the fact that each optical signal source generates its signal using transmitter clocks that are all based off of separate free running oscillators. For example, each transmitter clock may have a variance of +/−25 parts per million (ppm) from its nominal rate.

As discussed in more detail below, in digital return receiver 104b, each signal will be received in a separate clock domain and stored temporarily in a buffer. The rate at which the samples are read out from the buffer may be derived from one of the received optical signals, which arrives via what may be designated as the "master" input path. The remaining inputs may then be designated as "slave" input paths. In some embodiments, one of the clock domains may use the common reference signal described above. For example, the upstream signals generated using the transmitters synchronized with the downstream CW tone 137 may be received using adaptive receivers (e.g., resamplers 154 as discussed below) in which case the adaptation may converge to all having the same input clock rates for all data buffers 152a, 152b, 152n. An adaptive resampler 154 may be used to resample the slave signals with the master clock to ensure that their digital sample rates match that of the master signal sample rate. Fractional resampler designs are well known to those skilled in the art of multi-rate digital signal processing, and those used according to example embodiments may be operated such that their respective resampling fractions may be adjusted to prevent the associated buffers from emptying or overfilling.

For example, the inputs to each of the adaptive resamplers 154b, . . . , 154n is the buffer depth of each of the slave receive buffers 152b, . . . , 152n. The resampler 154 may adjust its resampling ratio to keep the average depth of each buffer centered around a nominal buffer depth. Since the resamplers 154b, . . . , 154n may need to continually adjust their resampling ratio between two steady state values, this adaptation rate may be kept at slow rate (e.g., 50 Hz or less). This will allow the buffer depth to vary about its nominal buffer depth, while still maintaining the outputs from the resamplers 154 to all remain at effectively equal clock sample rates.

More particularly, the upstream optical signals 145a, 145b, . . . , 145n from different remote nodes 140 are converted by respective optical receiver circuits 114a, 114b, . . . , 114n to corresponding digital data signals 115a, 115b, . . . , 115n for processing by the logic circuitry 116. One example of such logic circuitry 116 may be implemented using a field programmable gate array (FPGA), which enables one type of device to be stocked and available for deployment as well as customizations or updates to its operations. However, other forms of logic circuitry may also be used, including custom integrated circuit designs, application specific integrated circuits (ASICs), and so on.

In logic circuitry 116, data and clock recovery circuits 150a, 150b, . . . , 150n process digital data signals 115a, 115b, . . . , 115n to recover the digital data streams and their respective clocks, e.g., by performing data frame synchronization and timing recovery. Such recovery circuits 150a, 150b, . . . , 150n are well known to those skilled in the art and may be implemented using clock and data recovery circuits, delay-locked loop (DLL) circuits, or oversampling circuits. As noted above and depicted here, the first (upper) signal path (recovery circuit 150a, data buffer 152a) may be designated as the master path, while the remaining signal paths may be designated as slave paths, such as the second signal path (recovery circuit 150b, data buffer 152b, resampler circuit 154b).

Regarding the master path, the recovered master data 151ad of the first incoming signal 115a is temporarily stored in an associated buffer circuit 152a (e.g., a first-in first-out (FIFO) buffer) into which the recovered data 151ad is clocked by the recovered master clock 151ac and from which its output data 153ad is clocked by the recovered master clock 151ac. That output data 153ad is then combined (e.g., summed) digitally with output data 155b, . . . , 155n from the slave paths (discussed in more detail next).

Regarding the slave paths and with reference to the second path (first slave path) for example, the recovered slave data 151bd of the second incoming signal 115b is temporarily stored in an associated buffer circuit 152b (e.g., a first-in first-out (FIFO) buffer). Data and clock recovery circuit 150b may use an independent recovered sample clock 151bc to store recovered data 151bd in buffer circuit 152b.

To use a common timing base, adaptive resampler 154b resamples recovered data 151bd so that the digital sample rate match the sample rate of recovered master data 151ad. Adaptive resampler 154b adjusts its resampling ratio to keep the average depth of buffer circuit 152b centered around a nominal buffer depth. Since adaptive resampler 154b will need to continually adjust their resampling ratio between two values (e.g., recovered master clock 151ac and the buffer depth) in steady state, this adaptation rate may be kept below a very slow rate (e.g. 50 Hz or less). In this case, the buffer depth may vary slightly around its nominal buffer depth, but output data 155b from adaptive resampler 154b would all be at the same exact clock sample rate as recovered master clock 151ac. Adaptive resampler 154b is clocked by the recovered master clock 151ac, and also receives a status signal 153bc indicating the capacity of the buffer 152b. Depending upon the current state and changes in state of this status signal 153*bc*, the adaptive resampler 154*b* may maintain or adjust (e.g., increase or decrease) its sampling fraction to maintain output data 155*b* output by associated buffer 152*b* at the clock rate of recovered master clock 151*ac* while also keeping buffer 152*b* from emptying or overfilling.

At this point, output data 153*ad* from master path and output data 155*b*, . . . , 155*n* from the slave paths data 155 are synchronized to the same clock timing base. Digital summing logic 116 digitally sums output data 153*ad* from master path and output data 155*b*, . . . , 155*n*. As discussed above, following such processing by the digital summing logic 116, the combined digital data signal 117 may be converted by a digital-to-analog converter (DAC) circuit 118 to an analog signal 119. The resulting analog signal 119 may then be amplified by a RF amplifier 120 (e.g., having a variable RF signal gain to enable setting an appropriate output signal level) to produce the RF output signal 105 of the digital return transmitter subsystem. A digital signal with the data from RF output signal 105 is sent to the headend.

Figure 5:
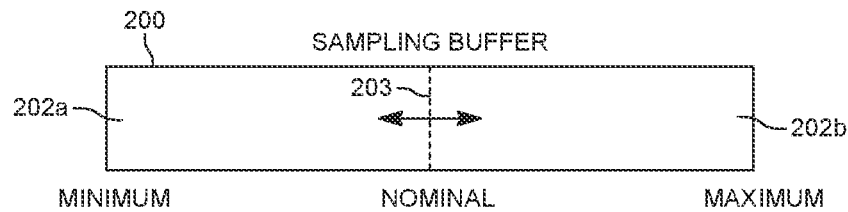
FIG. 5 depicts a variable sampling buffer for use in a digital return receiver architecture according to example embodiments.

FIG. 5 depicts a variable sampling buffer for use in a digital return receiver architecture according to example embodiments. Each of the data buffers 152*b*, . . . , 152*n* may be viewed as a buffer 200 having a used portion 202*a* and an unused portion 202*b*. As discussed above, as more recovered data arrives from the recovery circuitry 150*a*, 150*n*, the used portion 202*a* and unused portion 202*b* may increase and decrease, respectively, or decrease and increase, respectively, depending upon how quickly the adaptive re-samplers 154*b*, . . . , 154*n* are operating. Hence, the adaptive re-samplers 154*b*, . . . , 154*n* may monitor available capacities of their associated data buffers 152*b*, . . . , 152*n* by monitoring the relative capacities of the used 202*a* and unused 202*b* portions on either side of a desired nominal amount 203 representing the used portion 202*a* and/or unused portion 202*b*.

Method Flows

Figure 6:
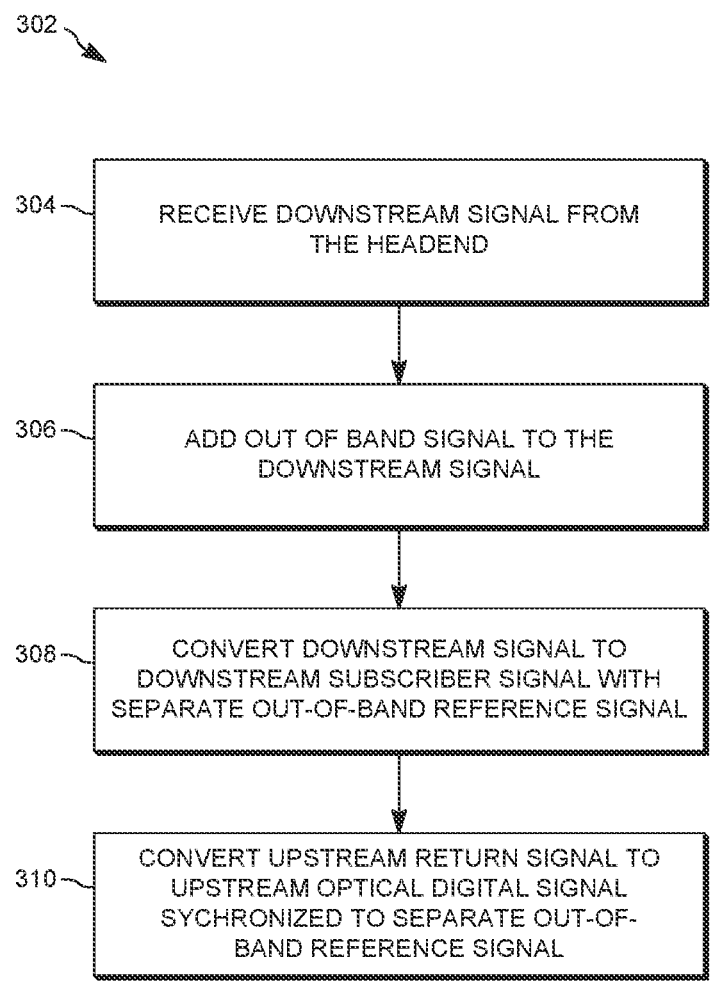
FIG. 6 depicts upstream signal flow management in a digital return receiver architecture according to example embodiments.

FIG. 6 depicts a flowchart 302 of upstream signal flow management in a digital return receiver architecture according to example embodiments. As discussed above in relation to FIG. 3, at 304, an example of upstream signal flow management 302 may begin by RPD node 130*a* receiving a downstream signal from the headend that is a digital signal including digital data. At 306, following which, an out-of-band (OoB) reference signal may be added to the downstream signal. Next, at remote node 140, the downstream optical signal may be converted to an RF downstream subscriber signal and the OoB reference signal is separated out at 308. In the reverse direction, at 310, an upstream return signal may be converted to an upstream optical digital signal synchronized to the OoB reference signal 310. Accordingly, if all remote nodes 140 perform the above process, the upstream optical digital signals are synchronized to a common timing source. When the upstream optical digital signals are received at RPD node 130*a*, the upstream optical digital signals are synchronized. According to example embodiments, all such steps or subsets of such steps may be performed in various orders.

Figure 7:
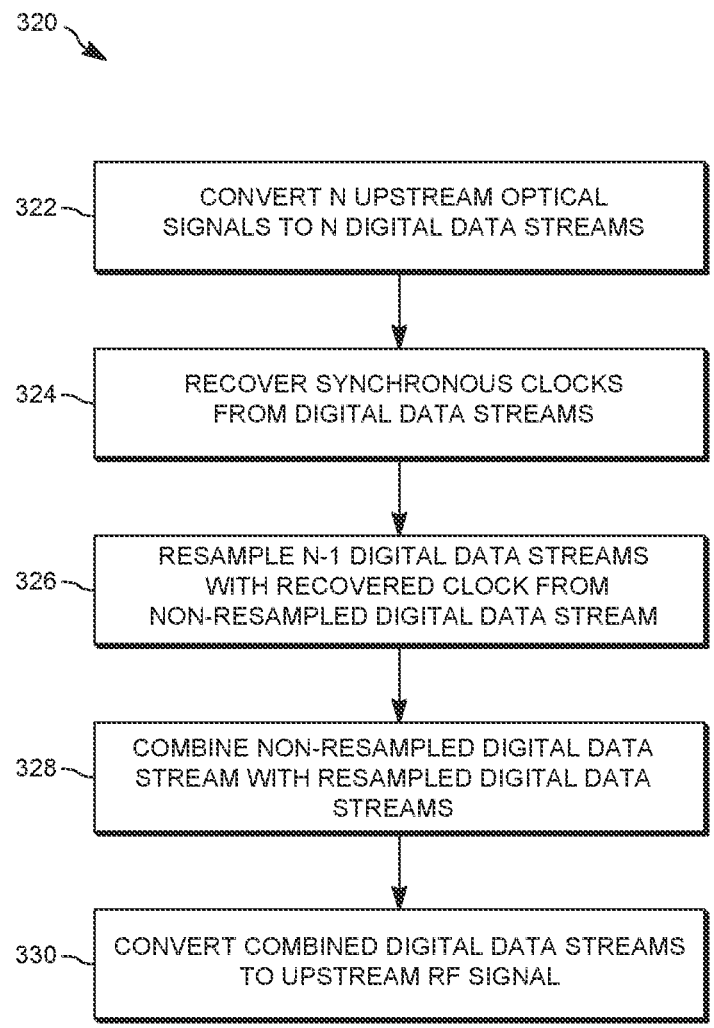
FIG. 7 depicts upstream signal flow management in a digital return receiver architecture according to further example embodiments.

FIG. 7 depicts a flowchart 320, of an upstream signal flow management in a digital return receiver architecture using adaptive resampling according to further example embodiments. As discussed above in relation to FIGS. 4A-4B, another example of upstream signal flow management may begin at 322 in RPD node 130*a* by converting N upstream optical signals to N digital data streams. At 324, following which independent clocks may be recovered from the digital data streams. Next, at 326, N-1 (of the N) digital data streams may resampled using the recovered clock from the non-resampled digital data stream. At 328, the non-resampled digital data stream may then be combined with the resampled digital data streams Then, at 330, following which the combined digital data streams may be converted to an upstream radio frequency (RF) signal. According to example embodiments, all such steps or subsets of such steps may be performed in various orders.

Embodiments

In some embodiments, a digital clock management system, comprising: input signal conversion circuitry configured to convert a plurality of input signals to a corresponding first plurality of digital data streams, wherein each of the first plurality of digital data streams contains respective digital data synchronized to a respective first data clock; first digital logic circuitry, coupled to the signal conversion circuitry, configured to: convert the first plurality of digital data streams to a second plurality of digital data streams, wherein each of the second plurality of digital data streams contains the digital data synchronized to the respective first data clock, and convert the second plurality of digital data streams to a third plurality of digital data streams, wherein each of the third plurality of digital data streams contains the digital data synchronized to a common clock; second digital logic circuitry, coupled to the first digital logic circuitry, configured to convert the third plurality of digital data streams to a single digital data stream; and output signal conversion circuitry, coupled to the second digital logic circuitry, configured to convert the single digital data stream to an output signal.

In some embodiments, the first digital logic circuitry comprises timing recovery circuitry configured to recover the respective first data clock from the respective digital data.

In some embodiments, the first digital logic circuitry comprises sampling circuitry to sample the second plurality of digital data streams to provide the third plurality of digital data streams.

In some embodiments, the first digital logic circuitry comprises: buffer circuitry configured to store the second plurality of digital data streams; and adaptive sampling circuitry, coupled to the buffer circuitry, configured to vary a sampling rate of the second plurality of digital data streams in accordance with the common clock.

In some embodiments, the adaptive sampling circuitry is configured to vary the sampling rate of the second plurality of digital data streams in accordance with an available storage capacity of the buffer circuitry.

In some embodiments, the second digital logic circuitry comprises digital summing circuitry that sums the third plurality of digital data streams.

In some embodiments, the output signal conversion circuitry comprises digital-to-analog conversion circuitry to convert the single digital data stream to an analog signal.

In some embodiments, the output signal conversion circuitry further comprises circuitry to amplify the analog signal.

In some embodiments, the first digital logic circuitry and the second digital logic circuitry comprise a field programmable gate array.

In some embodiments, the first digital logic circuitry is further configured to recover a respective first data clock from one of the first plurality of digital data streams to provide the common clock.

In some embodiments, the common clock is sent to a plurality of external devices that use the common clock to send the plurality of input signals.

In some embodiments, the input signal conversion circuitry is further configured to receive the plurality of input signals from a plurality of external devices; and the respective first data clocks comprise the common clock.

In some embodiments, the first digital logic circuitry is further configured to receive the common clock from the plurality of external devices.

In some embodiments, a digital clock management system, comprising: input signal converter means for converting a plurality of input signals to a corresponding first plurality of digital data streams, wherein each of the first plurality of digital data streams contains respective digital data synchronized to a respective first data clock; first digital logic means for: converting the first plurality of digital data streams to a second plurality of digital data streams, wherein each of the second plurality of digital data streams contains the digital data synchronized to the respective first data clock, and converting the second plurality of digital data streams to a third plurality of digital data streams, wherein each of the third plurality of digital data streams contains the digital data synchronized to a common clock; second digital logic means for converting the third plurality of digital data streams to a single digital data stream; and output signal converter means for converting the single digital data stream to an output signal.

In some embodiments, the first digital logic means comprises timing recovery means for recovering the respective first data clock from the respective plurality of digital data.

In some embodiments, the first digital logic means comprises: buffer means configured to store the second plurality of digital data streams; and adaptive sampling means, coupled to the buffer means, configured to vary a sampling rate of the second plurality of digital data streams in accordance with the common clock.

In some embodiments, the common clock is sent to a plurality of external devices that use the common clock to send the plurality of input signals.

In some embodiments, a method for managing a digital clock, comprising: converting a plurality of input signals to a corresponding first plurality of digital data streams, wherein each of the first plurality of digital data streams contains respective digital data synchronized to a respective first data clock; converting the first plurality of digital data streams to a second plurality of digital data streams, wherein each of the second plurality of digital data streams contains the respective digital data synchronized to the respective first data clock, converting the second plurality of digital data streams to a third plurality of digital data streams, wherein each of the third plurality of digital data streams contains the respective digital data synchronized to a common clock; converting the third plurality of digital data streams to a single digital data stream; and converting the single digital data stream to an output signal.

In some embodiments, the converting the first plurality of digital data streams to a second plurality of digital data streams comprises recovering the respective first data clock from the respective plurality of digital data.

In some embodiments, the common clock is sent to a plurality of external devices that use the common clock to send the plurality of input signals.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of some embodiments may be implemented. The above examples and embodiments should not be deemed to be the only embodiments and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. A digital clock management system, comprising:
   input signal conversion circuitry configured to convert a plurality of input signals to a corresponding first plurality of digital data streams, wherein each of the first plurality of digital data streams contains respective digital data synchronized to a respective first data clock;
   first digital logic circuitry, coupled to the signal conversion circuitry, comprising circuitry configured to recover the respective first data clock from the respective digital data, the first digital logic circuitry configured to:
      convert the first plurality of digital data streams to a second plurality of digital data streams, wherein each of the second plurality of digital data streams contains the digital data synchronized to the respective first data clock, and
      convert the second plurality of digital data streams to a third plurality of digital data streams, wherein each of the third plurality of digital data streams contains the digital data synchronized to a common clock;
   second digital logic circuitry, coupled to the first digital logic circuitry, configured to convert the third plurality of digital data streams to a single digital data stream; and
   output signal conversion circuitry, coupled to the second digital logic circuitry, configured to convert the single digital data stream to an output signal.

2. The system of claim 1, wherein the first digital logic circuitry comprises sampling circuitry to sample the second plurality of digital data streams to provide the third plurality of digital data streams.

3. The system of claim 1, wherein the first digital logic circuitry comprises:
   buffer circuitry configured to store the second plurality of digital data streams; and
   adaptive sampling circuitry, coupled to the buffer circuitry, configured to vary a sampling rate of the second plurality of digital data streams in accordance with the common clock.

4. The system of claim 3, wherein the adaptive sampling circuitry is configured to vary the sampling rate of the second plurality of digital data streams in accordance with an available storage capacity of the buffer circuitry.

5. The system of claim 1, wherein the second digital logic circuitry comprises digital summing circuitry that sums the third plurality of digital data streams.

6. The system of claim 1, wherein the output signal conversion circuitry comprises digital-to-analog conversion circuitry to convert the single digital data stream to an analog signal.

7. The system of claim 4, wherein the output signal conversion circuitry further comprises circuitry to amplify the analog signal.

8. The system of claim 1, wherein the first digital logic circuitry and the second digital logic circuitry comprise a field programmable gate array.

9. The system of claim 1, wherein the first digital logic circuitry is further configured to recover a respective first data clock from one of the first plurality of digital data streams to provide the common clock.

10. The system of claim 1, wherein the common clock is sent to a plurality of external devices that use the common clock to send the plurality of input signals.

11. The system of claim 1, wherein:
the input signal conversion circuitry is further configured to receive the plurality of input signals from a plurality of external devices; and
the respective first data clocks comprise the common clock.

12. The system of claim 10, wherein the first digital logic circuitry is further configured to receive the common clock from the plurality of external devices.

13. A method for managing a digital clock, comprising:
converting a plurality of input signals to a corresponding first plurality of digital data streams, wherein each of the first plurality of digital data streams contains respective digital data synchronized to a respective first data clock;
converting the first plurality of digital data streams to a second plurality of digital data streams, wherein each of the second plurality of digital data streams contains the respective digital data synchronized to the respective first data clock,
converting the second plurality of digital data streams to a third plurality of digital data streams, wherein each of the third plurality of digital data streams contains the respective digital data synchronized to a common clock;
converting the third plurality of digital data streams to a single digital data stream; and converting the single digital data stream to an output signal; and
sending the common clock to a plurality of external devices that use the common clock to send the plurality of input signals.

14. The method of claim 13, wherein the converting the first plurality of digital data streams to a second plurality of digital data streams comprises recovering the respective first data clock from the respective plurality of digital data.

15. A digital clock management system, comprising:
input signal conversion circuitry configured to convert a plurality of input signals to a corresponding first plurality of digital data streams, wherein each of the first plurality of digital data streams contains respective digital data synchronized to a respective first data clock;
first digital logic circuitry, coupled to the signal conversion circuitry, configured to:
convert the first plurality of digital data streams to a second plurality of digital data streams, wherein each of the second plurality of digital data streams contains the digital data synchronized to the respective first data clock, and
convert the second plurality of digital data streams to a third plurality of digital data streams, wherein each of the third plurality of digital data streams contains the digital data synchronized to a common clock;
second digital logic circuitry, coupled to the first digital logic circuitry, configured to convert the third plurality of digital data streams to a single digital data stream; and
output signal conversion circuitry comprising digital-to-analog conversion circuitry to convert the single digital data stream to an analog signal, the output signal conversion circuitry coupled to the second digital logic circuitry, and configured to convert the single digital data stream to an output signal.

16. The system of claim 15, wherein the first digital logic circuitry is further configured to recover a respective first data clock from one of the first plurality of digital data streams to provide the common clock.

17. The system of claim 15, wherein the first digital logic circuitry comprises sampling circuitry to sample the second plurality of digital data streams to provide the third plurality of digital data streams.

18. The system of claim 15, wherein the first digital logic circuitry comprises:
buffer circuitry configured to store the second plurality of digital data streams; and
adaptive sampling circuitry, coupled to the buffer circuitry, configured to vary a sampling rate of the second plurality of digital data streams in accordance with the common clock.

19. The system of claim 18, wherein the adaptive sampling circuitry is configured to vary the sampling rate of the second plurality of digital data streams in accordance with an available storage capacity of the buffer circuitry.

20. The system of claim 15, wherein the second digital logic circuitry comprises digital summing circuitry that sums the third plurality of digital data streams.

* * * * *